United States Patent
Ma

(10) Patent No.: US 10,229,639 B2
(45) Date of Patent: Mar. 12, 2019

(54) PIXEL DRIVING CIRCUIT FOR COMPENSATING DRIFTING THRESHOLD VOLTAGE OF DRIVING CIRCUIT PORTION AND DRIVING METHOD THEREOF

(71) Applicant: BOE TECHNOLOGY GROUP CO., LTD., Beijing (CN)

(72) Inventor: Zhanjie Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/514,821

(22) PCT Filed: Jan. 14, 2016

(86) PCT No.: PCT/CN2016/070881
§ 371 (c)(1),
(2) Date: Mar. 27, 2017

(87) PCT Pub. No.: WO2017/008484
PCT Pub. Date: Jan. 19, 2017

(65) Prior Publication Data
US 2017/0229070 A1 Aug. 10, 2017

(30) Foreign Application Priority Data
Jul. 15, 2015 (CN) .......................... 2015 1 0417355

(51) Int. Cl.
*G09G 3/3291* (2016.01)
*G09G 3/32* (2016.01)
(Continued)

(52) U.S. Cl.
CPC ............ *G09G 3/3291* (2013.01); *G09G 3/32* (2013.01); *G09G 3/3233* (2013.01);
(Continued)

(58) Field of Classification Search
CPC .................................................. G09G 3/3291
(Continued)

(56) References Cited

U.S. PATENT DOCUMENTS

| 2006/0061560 | A1 | 3/2006 | Yamashita et al. |
| 2006/0170628 | A1 | 8/2006 | Yamashita et al. |

(Continued)

FOREIGN PATENT DOCUMENTS

| CN | 1835058 A | 9/2006 |
| CN | 101866614 A | 10/2010 |

(Continued)

OTHER PUBLICATIONS

Third Chinese Office Action, for Chinese Patent Application No. 201510417355.5, dated Jul. 27, 2017, 15 pages.

(Continued)

*Primary Examiner* — Long D Pham
(74) *Attorney, Agent, or Firm* — Kinney & Lange, P.A.

(57) ABSTRACT

The embodiments of the present disclosure relate to display technology and provide a pixel driving circuit and an associated driving method, a display panel and a display apparatus, capable of avoiding influence of a drifting threshold voltage of a driving transistor on a driving current of an active light emitting device. The pixel driving circuit comprises a compensating unit, a data writing unit, a driving unit, a first energy storage unit, a second energy storage unit and a display unit. The embodiments of the present disclosure are applicable to display manufacture.

3 Claims, 8 Drawing Sheets

(51) Int. Cl.
  *G09G 3/3233* (2016.01)
  *G09G 3/3258* (2016.01)
  *G09G 3/3266* (2016.01)
  *H01L 51/52* (2006.01)

(52) U.S. Cl.
  CPC ......... *G09G 3/3258* (2013.01); *G09G 3/3266* (2013.01); *H01L 51/5203* (2013.01); *G09G 2300/0819* (2013.01); *G09G 2300/0852* (2013.01); *G09G 2300/0861* (2013.01); *H01L 2251/50* (2013.01)

(58) Field of Classification Search
  USPC ...................................................... 345/76, 82
  See application file for complete search history.

(56) References Cited

U.S. PATENT DOCUMENTS

| | | | |
|---|---|---|---|
| 2008/0001861 A1 | 1/2008 | Asano et al. | |
| 2008/0211746 A1 | 9/2008 | Caligiore et al. | |
| 2011/0273428 A1* | 11/2011 | Han | G09G 3/3233 345/212 |
| 2013/0057532 A1 | 3/2013 | Lee et al. | |
| 2014/0225878 A1* | 8/2014 | Shih | G09G 3/3258 345/205 |

FOREIGN PATENT DOCUMENTS

| | | |
|---|---|---|
| CN | 102982767 A | 3/2013 |
| CN | 103310732 A | 9/2013 |
| CN | 203288217 U | 11/2013 |
| CN | 104200771 A | 12/2014 |
| CN | 104200777 A | 12/2014 |
| CN | 104916257 A | 9/2015 |
| CN | 204808833 U | 11/2015 |

OTHER PUBLICATIONS

Chinese Rejection Decision, for Chinese Patent Application No. 201510417355.5, dated Oct. 9, 2017, 13 pages.
Extended European Search Report, for European Patent Application No. 16823633.9, dated Mar. 12, 2018, 11 pages.
International Search Report and Written Opinion (including English translation of Box V) dated Mar. 24, 2016, for corresponding PCT Application No. PCT/CN2016/070881.

* cited by examiner

PIXEL DRIVING CIRCUIT FOR COMPENSATING DRIFTING THRESHOLD VOLTAGE OF DRIVING CIRCUIT PORTION AND DRIVING METHOD THEREOF

TECHNICAL FIELD

The present disclosure relates to display technology, and more particularly, to a pixel driving circuit and an associated driving method, a display panel and a display apparatus.

BACKGROUND

Active Matrix Organic Light Emitting Diodes, or AMO-LEDs, have advantages such as low power consumption, low production cost, wide view angle and fast responding speed. Organic Light Emitting Diodes (OLEDs) are current-driven and their working principle is to combine electrons and hole to generate radiation light, i.e., to convert electric energy directly into light energy. Hence, they require stable currents for controlling light emission while displaying.

Conventionally, an OLED is driven by a Drive Thin Film Transistor (DTFT), which can be a P-type switching transistor. The DTFT has its gate connected to a data input terminal $V_{data}$, its source connected to a constant-voltage power supply input terminal $V_{DD}$, and its drain connected to the OLED. The voltage difference $V_{GS}$ created between $V_{DD}$ at the source and $V_{data}$ at the gate, such that the OLED connected to the drain the DTFT is on, with a driving current of the OLED $I_{OLED}=K(V_{GS}-V_{th})^2$ where $V_{th}$ is a threshold voltage of the DTFT itself and K is a constant.

It can be seen from the above formula of the driving current that the driving current $I_{OLED}$ flowing through the OLED will be influenced by the threshold voltage $V_{th}$ of the DTFT. Due to deviations in the manufacture process and aging of the equipment, the threshold voltage $V_{th}$ of the DTFT may drift across respective pixel units, resulting in errors in the driving current flowing through the OLED and, in turn, a degraded display effect.

SUMMARY

The embodiments of the present disclosure provide a pixel driving circuit and an associated driving method, a display panel and a display apparatus.

In an aspect of the present disclosure, a pixel driving circuit is provided. The pixel driving circuit comprises: a compensating unit connected to a first level terminal, a reset signal terminal, a control signal terminal, a reference signal terminal, a first node, a second node and a third node, and configured to write a level at the first level terminal to the second node and the third node under control of the control signal terminal and the reset signal terminal and write a level at the reference signal terminal to the first node under control of the reset signal terminal; a data writing unit connected to a scan signal terminal, a data signal terminal and the second node, and configured to write a signal at the data signal terminal to the second node under control of the scan signal terminal; a first energy storage unit connected to the first node and the second node, and configured to store a voltage between the first node and the second node; a second energy storage unit connected to the first level terminal and the second node, and configured to store a voltage between the first level terminal and the second node; a driving unit connected to the first node, the third node and the display unit, and configured to output a driving signal under control of the first node and the third node; and a display unit connected to the driving unit and the second level terminal, and configured to display grayscales under control of the driving signal and the second level terminal.

According to an example embodiment of the present disclosure, the compensating unit can comprise a second transistor, a third transistor and a fourth transistor. The second transistor has its gate connected to the reset signal terminal, its first electrode connected to the third node, and its second electrode connected to the second node. The third transistor has its gate connected to the control signal terminal, its first electrode connected to the first level terminal, and its second electrode connected to the third node. The fourth transistor has its gate connected to the reset signal terminal, its first electrode connected to the reference signal terminal, and its second electrode connected to the first node.

According to an example embodiment of the present disclosure, the data writing unit comprises: a first transistor having its gate connected to the scan signal terminal, its first electrode connected to the data signal terminal and its second electrode connected to the second node.

According to an example embodiment of the present disclosure, the driving unit comprises a driving transistor having its gate connected to the first node, its first electrode connected to the third node and its second electrode connected to the display unit.

According to an example embodiment of the present disclosure, the first energy storage unit comprises a first capacitor having its first terminal connected to the first node and its second terminal connected to the second node.

According to an example embodiment of the present disclosure, the second energy storage unit comprises a second capacitor having its first terminal connected to the first level terminal and its second terminal connected to the second node.

According to an example embodiment of the present disclosure, the display unit comprises an Organic Light Emitting Diode (OLED) having its first electrode connected to the driving unit and its second electrode connected to the second level terminal.

In another aspect of the present disclosure, a display panel is provided. The display panel comprises the above pixel driving circuit.

In another aspect of the present disclosure, a display apparatus is provided. The display apparatus comprises the above display panel.

In yet another aspect of the present disclosure, a driving method for the above pixel driving circuit is provided. The method comprises: a first phase in which the compensating unit writes a level at the first level terminal to the second node and the third node under control of the reset signal terminal and the control signal terminal and writes a level at the reference signal terminal to the first node under control of the reset signal terminal; a second phase in which the second node is discharged via the driving unit and the display unit, and the first energy storage unit stores a threshold voltage of the driving unit; a third phase in which the data writing unit writes a signal at the data signal terminal to the second node under control of the scan signal terminal; and a fourth phase in which the compensating unit writes the level at the first level terminal to the third node under control of the control signal terminal, the second energy storage unit stores a voltage between the second node and the first level terminal, the first energy storage unit stores a voltage between the second node and the first node, and driving unit outputs a driving signal to the display, and the display unit displays grayscales under control of the driving signal and the second level terminal.

According to an example embodiment of the present disclosure, the compensating unit comprises a second transistor, a third transistor and a fourth transistor. In the first phase, the second transistor, the third transistor and the fourth transistor are all on, such that the level at the first level terminal is written to the third node via the third transistor and to the second node via the second transistor and the third transistor, and the level at the reference signal terminal is written to the first node via the fourth transistor. In the second phase, the second transistor and the fourth transistor are on, while the third transistor is off. In the third phase, the second transistor, the third transistor and the fourth transistor are all off. In the fourth phase, the second transistor and the fourth transistor are off, while the third transistor is on, such that the level at the first level terminal is written to the third node via the third transistor.

According to an example embodiment of the present disclosure, the data writing unit comprises a first transistor. In the first phase, the first transistor is off. In the second phase, the first transistor is off. In the third phase, the first transistor is on, such that the signal at the data signal terminal is written to the second node via the first transistor. In the fourth phase, the first transistor is off.

BRIEF DESCRIPTION OF THE DRAWINGS

In order to illustrate the solutions according to the embodiments of the present application clearly, the figures used for description of the embodiments will be introduced briefly here. It is apparent to those skilled in the art that the figures described below only illustrate some embodiments of the present disclosure and other figures can be obtained from these figures without applying any inventive skills.

DETAILED DESCRIPTION OF THE EMBODIMENTS

In the following, the solutions according to the embodiments of the present disclosure will be described clearly and fully with reference to the figures. Obviously, the embodiments described below are only some, rather than all, of the embodiments. Starting from the embodiments of the present disclosure, those skilled in the art can obtain other embodiments with applying any inventive skills. All these embodiments are to be encompassed by the scope of the present disclosure.

In all the embodiments of the present disclosure, each transistor can be a Thin Film Transistor (TFT), a Field Effect Transistor (FET) or any other device having the same characteristics. The transistors in the embodiments of the present disclosure are mainly switching transistors, depending on their functions in circuits. Since the gate and drain of each switching transistor as used herein are symmetric, they can be interchangeable. In the embodiments of the present disclosure, for a P-type transistor as an example, two electrodes other than the gate are referred to as a first electrode and a second electrode, respectively. It can be appreciated by those skilled in the art that the switching transistors in the embodiments of the present disclosure may include both P-type and N-type switching transistors. Here, a P-type switching transistor is on when its gate is at a low level and off when its gate is at a high level. An N-type switching transistor is on when its gate is at a high level and off when its gate is at a low level. A driving transistor can be P-type or N-type. A P-type driving transistor is in an amplification or saturation state when its gate voltage is at a low level (lower than its source voltage) and the absolute value of the voltage difference between its gate and source is larger than a threshold voltage. An N-type driving transistor is in an amplification or saturation state when its gate voltage is at a high level (higher than its source voltage) and the absolute value of the voltage difference between its gate and source is larger than a threshold voltage.

Figure 1:
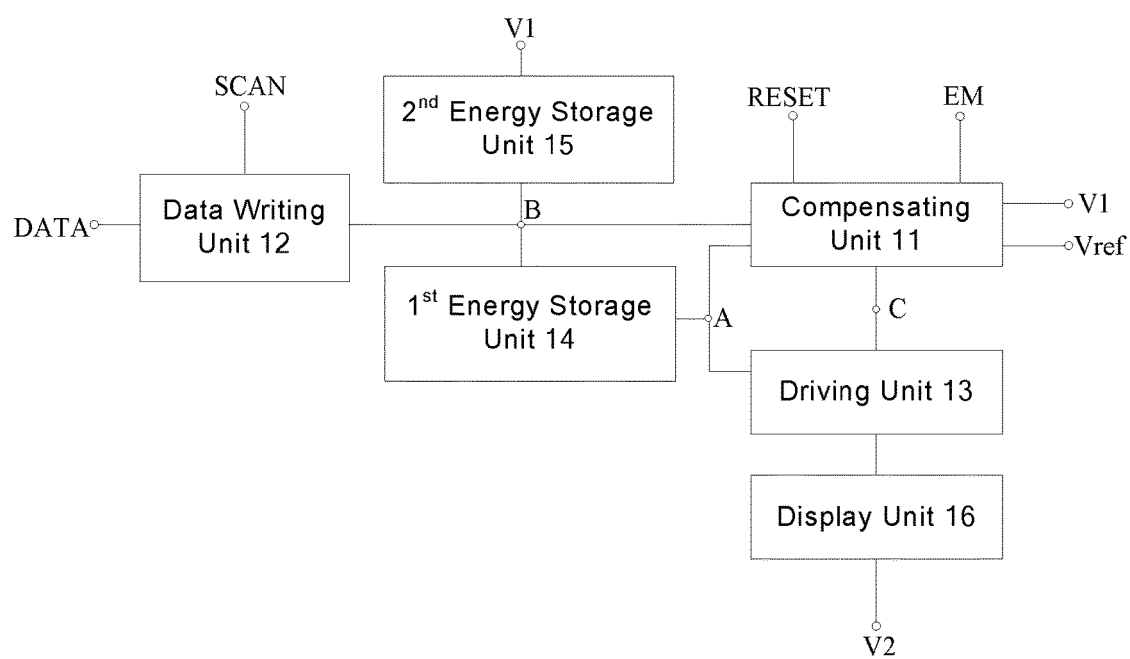
FIG. 1 is a schematic diagram showing a structure of a pixel driving circuit according to an embodiment of the present disclosure.

FIG. 1 is a schematic diagram showing a structure of a pixel driving circuit according to an embodiment of the present disclosure. As shown in FIG. 1, the pixel driving circuit according to the embodiment of the present disclosure can include: a compensating unit 11, a data writing unit 12, a driving unit 13, a first energy storage unit 14, a second energy storage unit 15 and a display unit 16.

The compensating unit 11 is connected to a first level terminal, V1, a reset signal terminal, RESET, a control signal terminal, EM, a reference signal terminal, Vref, a first node, A, a second node, B and a third node, C. The compensating unit 11 is configured to write a level at the first level terminal V1 to the second node B and the third node C under control of the control signal terminal EM and the reset signal terminal RESET, and write a level at the reference signal terminal Vref to the first node A under control of the reset signal terminal RESET.

The data writing unit 12 is connected to a scan signal terminal, SCAN, a data signal terminal, DATA, and the second node B, and is configured to write a signal at the data signal terminal DATA to the second node B under control of the scan signal terminal SCAN.

The first energy storage unit 14 is connected to the first node A and the second node B, and is configured to store a voltage between the first node A and the second node B.

The second energy storage unit 15 is connected to the first level terminal V1 and the second node B, and is configured to store a voltage between the first level terminal V1 and the second node B.

The driving unit 13 is connected to the first node A, the third node C and the display unit 16, and is configured to output a driving signal to the display unit 16 under control of the first node A and the third node C.

The display unit 16 is connected to the driving unit 13 and the second level terminal V2, and is configured to display grayscales under control of the driving signal 13 and the second level terminal V2.

In order to compensate for the threshold voltage of the driving unit, the functions of the respective units are described as follows. First, the compensating unit 11 writes the level at the first level terminal to the second node and the third node under control of the reset signal terminal and the control signal terminal, and writes the level at the reference signal terminal to the first node under control of the reset signal terminal. Next, the second node is discharged via the driving unit and the display unit, and the first energy storage unit stores a threshold voltage of the driving unit. Then, the data writing unit writes the signal at the data signal terminal to the second node under control of the scan signal terminal. Finally, the compensating unit writes the level at the first level terminal to the third node under control of the control signal terminal, the second energy storage unit stores the voltage between the second node and the first level terminal, the first energy storage unit stores the voltage between the second node and the first node, the driving unit outputs the driving signal to the display unit, and the display unit displays grayscales under control of the driving signal and the second level terminal. Since the first energy storage unit stores the threshold voltage of the driving unit, in the light emission phase, the stored threshold voltage can be used directly to compensate for the threshold voltage of the driving unit.

Figure 2:
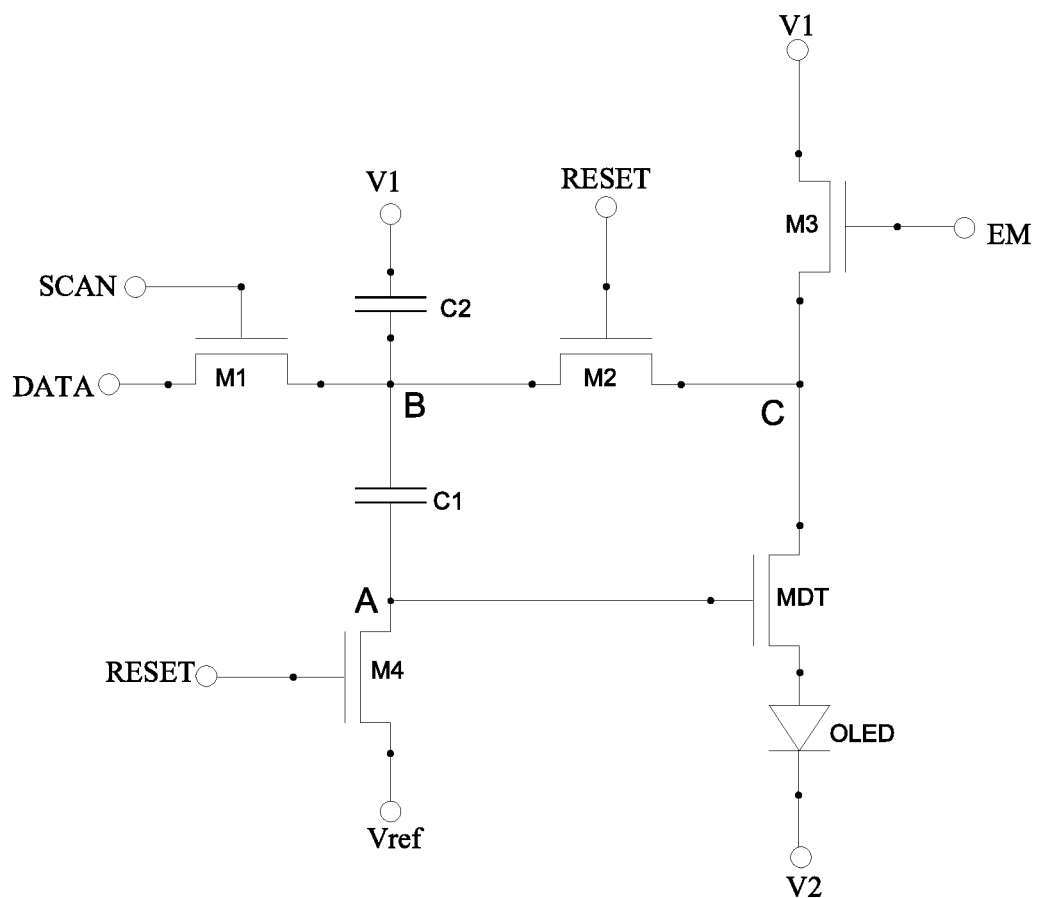
FIG. 2 is a schematic diagram showing an exemplary circuit structure of the pixel driving circuit shown in FIG. 1.

FIG. 2 is a schematic diagram showing an exemplary circuit structure of the pixel driving circuit shown in FIG. 1. The exemplary circuit structure of the pixel driving circuit according to the embodiment of the present disclosure will be described below with reference to FIG. 1 and FIG. 2. As shown in FIG. 2, the compensating unit 11 of the pixel driving circuit includes a second transistor, M2, a third transistor, M3, and a fourth transistor, M4. The second transistor M2 has its gate connected to the reset signal terminal RESET, its first electrode connected to the third node C, and its second electrode connected to the second node B. The third transistor M3 has its gate connected to the control signal terminal EM, its first electrode connected to the first level terminal V1, and its second electrode connected to the third node C. The fourth transistor M4 has its gate connected to the reset signal terminal RESET, its first electrode connected to the reference signal terminal Vref, and its second electrode connected to the first node A.

The data writing unit 12 can include: a first transistor M1 having its gate connected to the scan signal terminal SCAN, its first electrode connected to the data signal terminal DATA and its second electrode connected to the second node B.

The driving unit 13 includes a driving transistor, MDT, having its gate connected to the first node A, its first electrode connected to the third node C and its second electrode connected to the display unit 16.

The first energy storage unit 14 includes a first capacitor, C1, having its first terminal connected to the first node A and its second terminal connected to the second node B.

The second energy storage unit 15 includes a second capacitor, C2, having its first terminal connected to the first level terminal V1 and its second terminal connected to the second node B.

The display unit 16 includes an Organic Light Emitting Diode (OLED) having its first electrode connected to the driving unit 13 and its second electrode connected to the second level terminal V2.

In order to compensate for the threshold voltage of the driving unit, the functions of the respective units are described as follows. First, in the compensating unit 11, the reset signal terminal controls the transistor M2, and the control signal terminal controls M3, to write the level at the first level terminal to the second node B and the third node C, and the reset signal terminal controls the transistor M4 to write the level at the reference signal terminal to the first node. Next, the second node is discharged via the driving transistor MDT in the driving unit and the OLED in the display unit, and the capacitor C1 in the first energy storage unit stores the threshold voltage of the driving transistor MDT in the driving unit. Then, the scan signal terminal in the data writing unit controls the transistor M1 to write the signal at the data signal terminal to the second node under. Finally, the control signal terminal in the compensating unit controls the transistor M3 to write the level at the first level terminal to the third node, the capacitor C2 in the second energy storage unit stores the voltage between the second node and the first level terminal, the capacitor C1 in the first energy storage unit stores the voltage between the second node and the first node, the MDT in the driving unit outputs the driving signal to the OLED in the display unit, and the OLED in the display unit displays grayscales under control of the driving signal and the second level terminal. Since the capacitor C1 in the first energy storage unit stores the threshold voltage of the MDT in the driving unit, in the light emission phase, the stored threshold voltage can be used directly to compensate for the threshold voltage of the MDT in the driving unit.

The above transistors are all N-type or P-type transistors. Of course, in the manufacture process of display panels, it is advantageous to use the same type of transistors to reduce the manufacture process and ensure the uniformity of the device performance. In the above embodiment, P-type transistors are used. Further, the light emitting device here can be an OLED. When the first electrode of the OLED is anode, the level $V_2$ at the second level terminal is lower than the level $V_1$ at the first level terminal. For example, the low level is a ground terminal. Of course, FIG. 2 is described assuming the first electrode of the OLED to be anode.

Referring to the pixel driving circuit according to the embodiment of the present disclosure as described above, a driving method for the above pixel driving circuit is provided. The driving method can include: a first phase in which the compensating unit writes a level at the first level terminal to the second node and the third node under control of the reset signal terminal and the control signal terminal and writes a level at the reference signal terminal to the first node under control of the reset signal terminal; a second phase in which the second node is discharged via the driving unit and the display unit, and the first energy storage unit stores a threshold voltage of the driving unit; a third phase in which the data writing unit writes a signal at the data signal terminal to the second node under control of the scan signal terminal; and a fourth phase in which the compensating unit writes the level at the first level terminal to the third node under control of the control signal terminal, the second energy storage unit stores a voltage between the second node and the first level terminal, the first energy storage unit stores a voltage between the second node and the first node, and driving unit outputs a driving signal to the display, and the display unit displays grayscales under control of the driving signal and the second level terminal.

Optionally, the compensating unit includes a second transistor, a third transistor and a fourth transistor. In the first phase, the second transistor, the third transistor and the fourth transistor are all on, such that the level at the first level terminal is written to the third node via the third transistor and to the second node via the second transistor and the third transistor, and the level at the reference signal terminal is written to the first node via the fourth transistor. In the second phase, the second transistor and the fourth transistor are on, while the third transistor is off. In the third phase, the second transistor, the third transistor and the fourth transistor are all off. In the fourth phase, the second transistor and the fourth transistor are off, while the third transistor is on, such that the level at the first level terminal is written to the third node via the third transistor.

Optionally, the data writing unit includes a first transistor. In the first phase, the first transistor is off. In the second phase, the first transistor is off. In the third phase, the first transistor is on, such that the signal at the data signal terminal is written to the second node via the first transistor. In the fourth phase, the first transistor is off.

Figure 3:
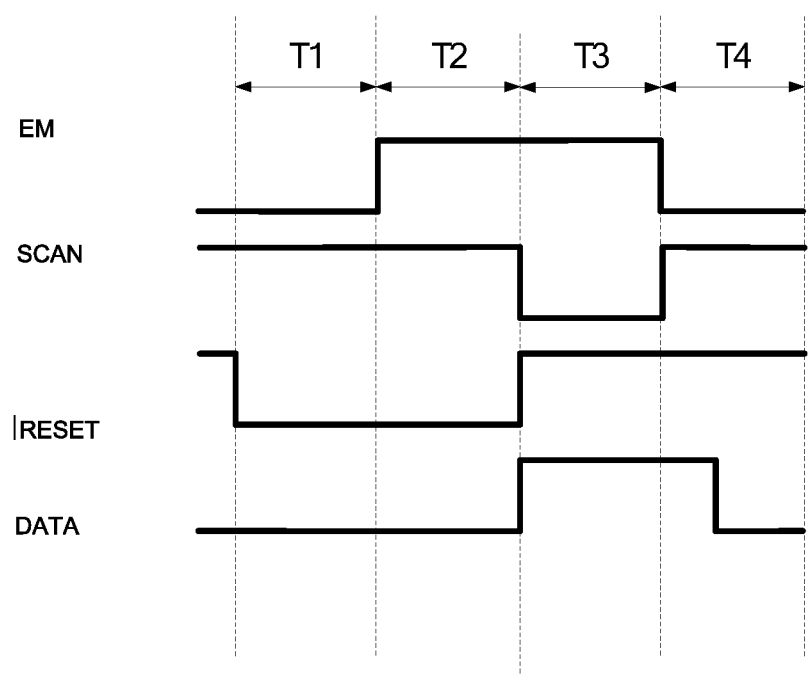
FIG. 3 is a schematic diagram showing a signal timing sequence/state for the pixel driving circuit shown in FIG. 2.
Figure 4A:
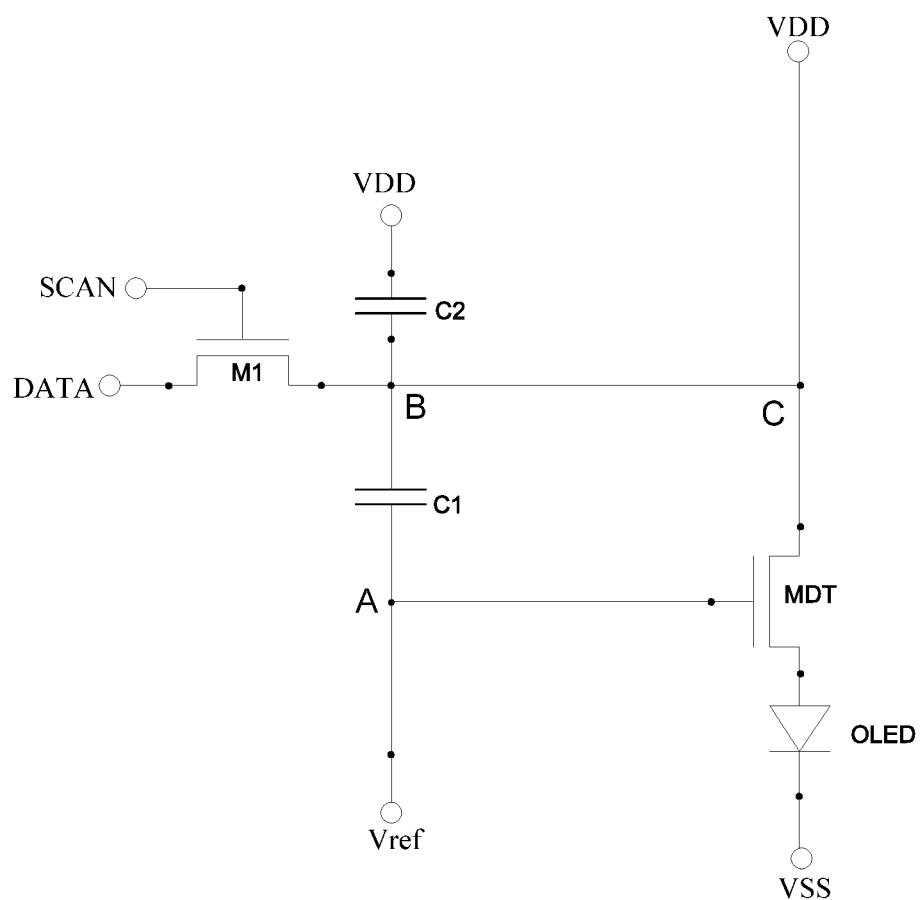
FIG. 4a is a schematic diagram showing an equivalent circuit of the pixel driving circuit shown in FIG. 2 in a first time period.
Figure 4B:
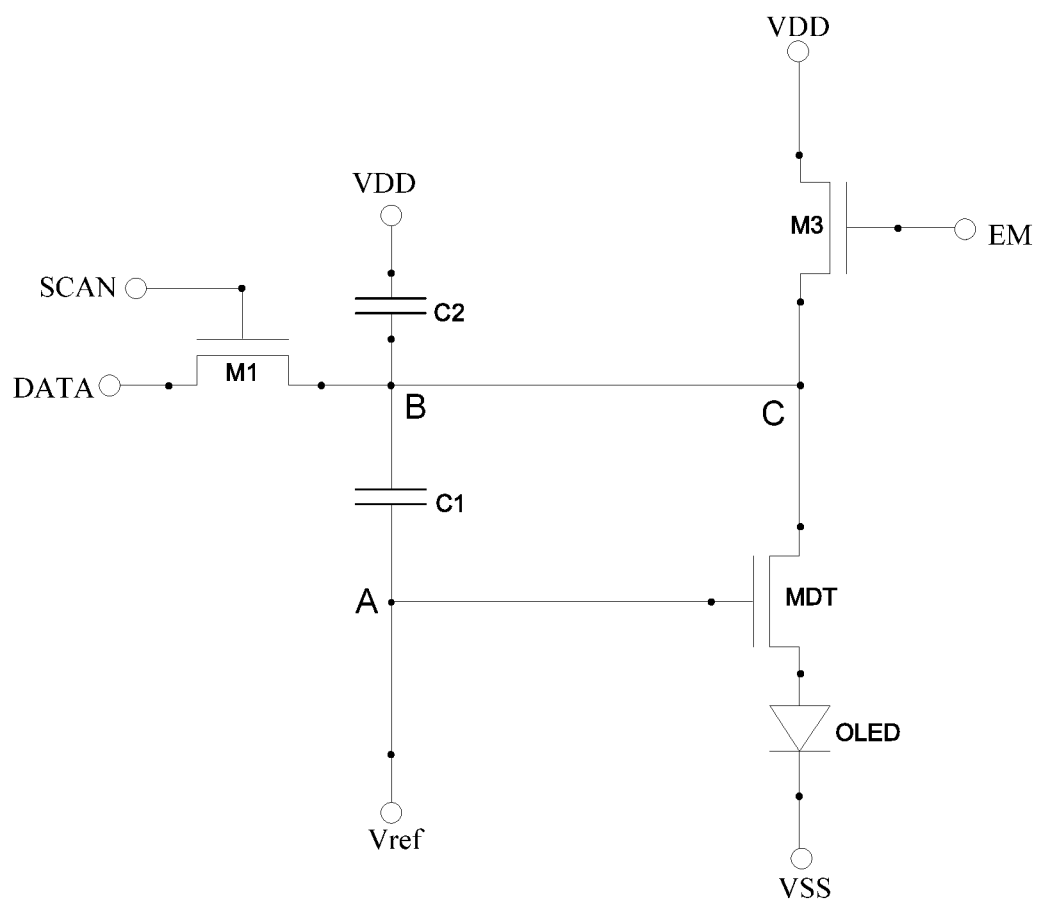
FIG. 4b is a schematic diagram showing an equivalent circuit of the pixel driving circuit shown in FIG. 2 in a second time period.
Figure 4C:
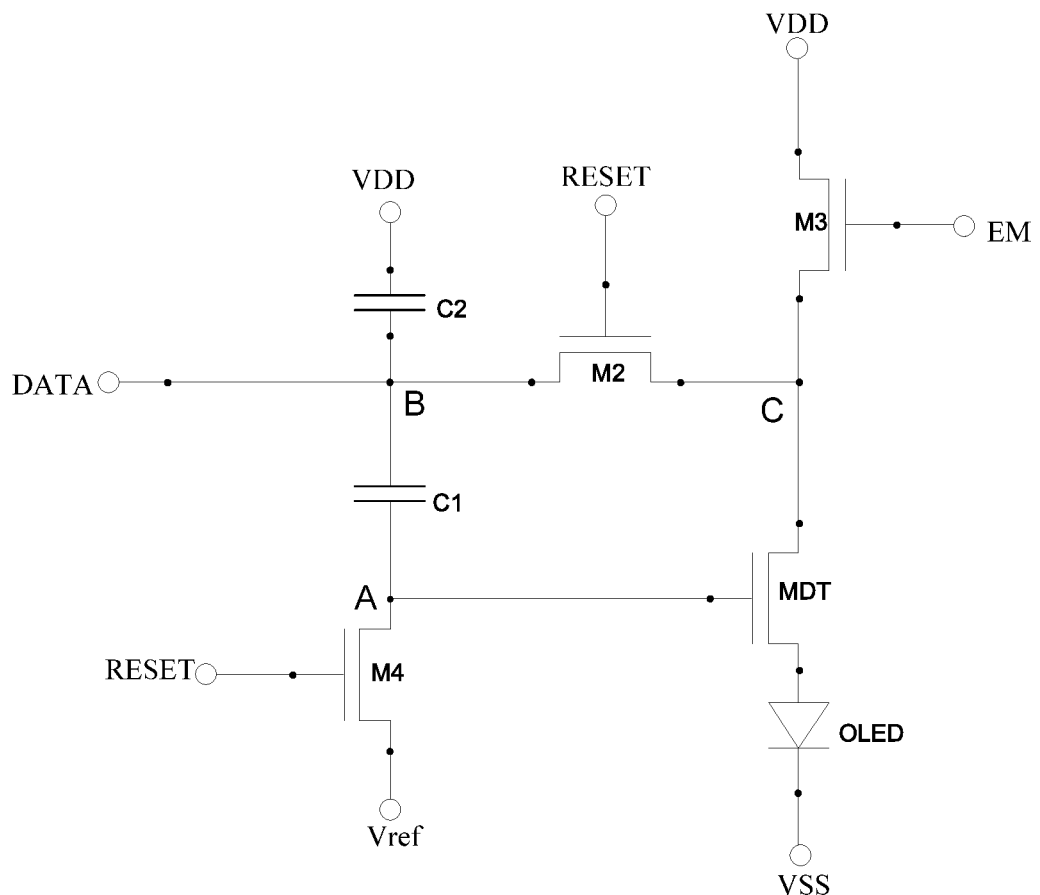
FIG. 4c is a schematic diagram showing an equivalent circuit of the pixel driving circuit shown in FIG. 2 in a third time period.
Figure 4D:
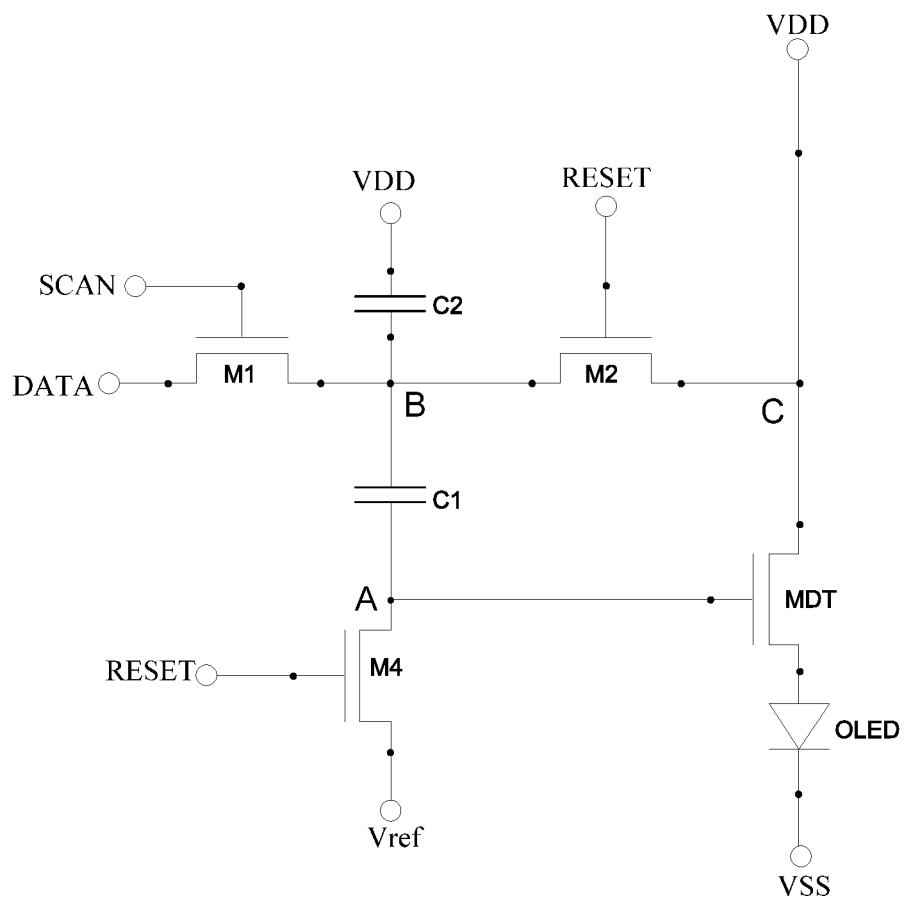
FIG. 4d is a schematic diagram showing an equivalent circuit of the pixel driving circuit shown in FIG. 2 in a fourth time period.

In this context, it is assumed that the transistors M1-M4 and the driving transistor DTFT are all P-type switching transistors. The terminal V1 is a high-level VDD signal and the terminal V2 is a low-level VSS signal. Referring to the pixel driving circuit as shown in FIG. 2, a schematic diagram of signal timing sequence/state for the pixel driving circuit as shown in FIG. 3, and schematic diagrams of equivalent circuits of the pixel driving circuit in operation states in respective phases as shown in FIGS. 4a-4d, a driving method for the pixel driving circuit is provided according to an embodiment of the present disclosure. The working principles of the circuit can be divided into four parts, a first phase T1 of resetting, a second phase T2 of writing the threshold voltage to the driving transistor, a third phase T3 of writing the data signal, and the fourth phase T4 of light emitting.

In the resetting phase (T1), RESET=0, EM=0 and SCAN=1. It is to be noted that in the following embodiment, "0" indicates a low level and "1" indicates a high level. Referring to the equivalent circuit diagram shown in FIG. 4a, RESET and EM are low-voltage on signals and SCAN is a high-voltage off signal. RESET turns on the transistors M2 and M4. M2 being turned on allows the nodes B and C to be connected via M2. M4 being turned on allows the Vref signal at the Vref terminal to be written to the node A. EM turns on the transistor M3 and writes the VDD signal to the node C. Hence, the potentials at the nodes A and B of the capacitors C1 and C2 are reset to the potentials of Vref and VDD, respectively.

In the threshold voltage writing phase (T2), RESET=0, EM=1 and SCAN=1. During this phase, RESET is a low-voltage on signal and SCAN and EM are high-voltage off signals. In this case, EM turns off M3, such that the VDD signal written in the phase T1 at the node B is discharged via the driving transistor MDT and the OLED, until the source potential of the driving transistor MDT is so low that the MDT is in a critical state before off or in an off state. Then, the potential at the node B becomes Vref−Vth, where Vth is the threshold voltage of MDT. Hence, the voltages at the two terminals of the capacitor C1 are Vref at the node A and Vref−Vth at the node B, respectively. The capacitor C1 then maintains the threshold voltage of MDT at C1.

In the output writing phase (T3), RESET=1, EM=1 and SCAN=0. In this case, only SCAN is a low-voltage on signal, while RESET and EM are both high-voltage off signals. SCAN turns on the transistor M1 and writes the Vdata signal at the data signal terminal DATA to the node B via M1. At this time, the other node A of the capacitor C1 is floating. In accordance with the law of charge conservation of capacitor, the charge quantity of the capacitor C1 before the change is (Vref−Vth−Vref)*C1. Assuming that the potential at the node A after the change is X, the charge quantity after the change will be (Vdata−X)*C1. The charge quantity remains the same before and after the change, that is, (Vref−Vth−Vref)*C1=(Vdata−X)*C1, i.e., X=Vdata+Vth.

In the light emitting phase (T4), RESET=1, EM=0, SCAN=1. RESET and SCAN are high-voltage off signals and EM is a low-voltage on signal. Since M2 is off, the node B and the node C will be interfere with each other. The potential at the node B can be stored by the capacitor C2 and the potential VDD at the terminal V1. In this case, the charge at the node A can stored by the node B and C1 indirectly, so as to keep the potential at the node A in the light emitting phase the same as in the phase T3, i.e., Vdata+Vth. Since the driving transistor MDT is in the saturation state, it can be obtained in accordance with the formula of current in saturation region of transistor that:

$$I_{OLED} = \frac{1}{2}K(V_{GS} - V_{th})^2$$
$$= \frac{1}{2}K[Vdata + Vth - VDD - Vth]^2$$
$$= \frac{1}{2}K(Vdata - VDD)^2$$

where $V_{GS}$ is the difference between the source and the gate of MDT, $$K = \mu C_{OX} \frac{W}{L},$$

μ and $C_{ox}$ are process constants, W is the channel width of MDT, and L is the channel length of the transistor. Both W and L are selectable constants. Hence, the amplitude of the current is only dependent on SD and VDD.

It can be seen from the above equation that the working current $I_{OLED}$ is not influenced by the threshold voltage Vth and is dependent only on Vdata. In this way, the problem associated with the drifting threshold voltage of the driving transistor MDT due to manufacture process and long-term operation can be solved. Its influence on $I_{OLED}$ can be eliminated to ensure the normal function of the OLED.

Figure 5:
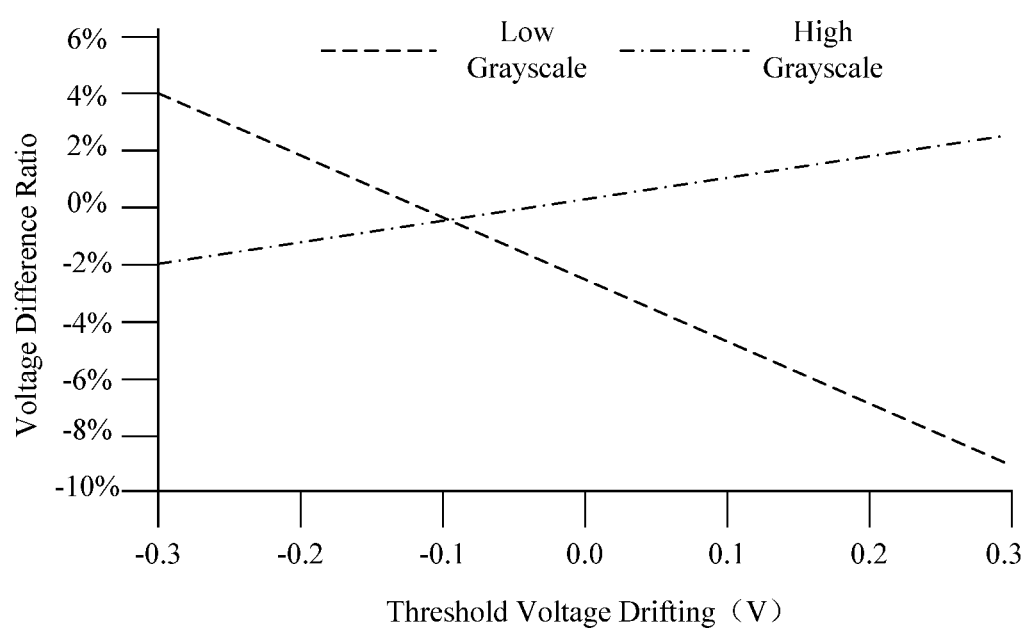
FIG. 5 is a schematic diagram showing a compensation effect for a threshold voltage of a pixel driving circuit according to an embodiment of the present disclosure.

FIG. 5 shows current variations as the threshold voltage of the driving transistor MDT varies when the circuit structure is at high and low grayscales. As shown in FIG. 5, the vertical axis denotes current different ratio and the horizontal axis denotes threshold voltage drifting. In the high grayscale state, when the current difference ratio ranges from −2% to 2%, the threshold voltage drifting can be constrained to −0.3V to 0.3V. In the low grayscale state, when the current difference ratio ranges from 4% to −8%, the threshold voltage drifting can be constrained to −0.3V to 0.3V. That is, no matter in the high or low grayscale state, given a current different ratio that meets the normal operation condition, the threshold voltage drifting of MDT can be constrained to a small range. Hence, it can be seen that the above solution has a good compensation effect for the variation of Vth.

According to an embodiment of the present disclosure, a display panel is provided. The display panel includes the above pixel driving circuit.

According to an embodiment of the present disclosure, a display apparatus is provided. The display apparatus includes the above display panel.

Further, the display apparatus can be an e-paper, a mobile phone, a television, a digital frame or any other display device.

The display apparatus according to the embodiment of the present disclosure is capable of avoiding influence of a drifting threshold voltage of a driving transistor in a driving unit on a driving current of an active light emitting device by providing a compensating unit for compensating for the threshold voltage of the driving unit and thereby improving evenness of a displayed image.

While the embodiments of the present invention have been described above, the scope of the present invention is not limited thereto. Various modifications and alternatives can be made by those skilled in the art without departing from the scope of the present disclosure. These modifications and alternatives are to be encompassed by the scope of the present invention which is only defined by the claims as attached.

What is claimed is:

1. A driving method for a pixel driving circuit, the pixel driving circuit comprising:
   a compensating circuit portion connected to a first level terminal, a reset signal terminal, a control signal terminal, a reference signal terminal, a first node, a second node and a third node, and configured to write a level at the first level terminal to the second node and the third node under control of the control signal terminal and the reset signal terminal and write a level at the reference signal terminal to the first node under control of the reset signal terminal;
   a data writing circuit portion connected to a scan signal terminal, a data signal terminal and the second node, and configured to write a signal at the data signal terminal to the second node under control of the scan signal terminal;
   a first energy storage circuit portion connected to the first node and the second node, and configured to store a voltage between the first node and the second node;
   a second energy storage circuit portion connected to the first level terminal and the second node, and configured to store a voltage between the first level terminal and the second node;
   a driving circuit portion connected to the first node, the third node and a display circuit portion, and configured to output a driving signal under control of the first node and the third node; and
   the display circuit portion connected to the driving circuit portion and the second level terminal, and configured to display grayscales under control of the driving signal and the second level terminal,
   wherein the method comprises:
      a first phase in which the compensating circuit portion writes a level at the first level terminal to the second node and the third node under control of the reset signal terminal and the control signal terminal and writes a level at the reference signal terminal to the first node under control of the reset signal terminal;
      a second phase in which the second node is discharged via the driving circuit portion and the display circuit portion, and the first energy storage circuit portion stores a threshold voltage of the driving circuit portion;
      a third phase in which the data writing circuit portion writes a signal at the data signal terminal to the second node under control of the scan signal terminal; and
      a fourth phase in which the compensating circuit portion writes the level at the first level terminal to the third node under control of the control signal terminal, the second energy storage circuit portion stores a voltage between the second node and the first level terminal, the first energy storage circuit portion stores a voltage between the second node and the first node, and driving circuit portion outputs a driving signal to the display, and the display circuit portion displays grayscales under control of the driving signal and the second level terminal.

2. The method of claim 1, wherein the compensating circuit portion comprises a second transistor, a third transistor and a fourth transistor, and wherein
   in the first phase, the second transistor, the third transistor and the fourth transistor are all on, such that the level at the first level terminal is written to the third node via the third transistor and to the second node via the second transistor and the third transistor, and the level at the reference signal terminal is written to the first node via the fourth transistor,
   in the second phase, the second transistor and the fourth transistor are on, while the third transistor is off,
   in the third phase, the second transistor, the third transistor and the fourth transistor are all off, and
   in the fourth phase, the second transistor and the fourth transistor are off, while the third transistor is on, such that the level at the first level terminal is written to the third node via the third transistor.

3. The method of claim 1, wherein the data writing circuit portion comprises a first transistor, and wherein
   in the first phase, the first transistor is off,
   in the second phase, the first transistor is off,
   in the third phase, the first transistor is on, such that the signal at the data signal terminal is written to the second node via the first transistor, and
   in the fourth phase, the first transistor is off.

* * * * *